(12) United States Patent
Wu et al.

(10) Patent No.: US 10,276,473 B2
(45) Date of Patent: Apr. 30, 2019

(54) EASILY DETACHABLE CPU CLIP

(71) Applicant: FOXCONN INTERCONNECT TECHNOLOGY LIMITED, Grand Cayman (KY)

(72) Inventors: Heng-Kang Wu, Shenzhen (CN); Fu-Jin Peng, Shenzhen (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/856,102

(22) Filed: Dec. 28, 2017

(65) Prior Publication Data
US 2018/0190561 A1 Jul. 5, 2018

(30) Foreign Application Priority Data
Dec. 29, 2016 (CN) ...................... 2016 2 1470152 U

(51) Int. Cl.
*H01L 23/32* (2006.01)
*H01R 13/635* (2006.01)
*H01R 12/70* (2011.01)
*H01R 13/22* (2006.01)
*H05K 1/18* (2006.01)

(52) U.S. Cl.
CPC .......... *H01L 23/32* (2013.01); *H01R 12/7058* (2013.01); *H01R 12/7076* (2013.01); *H01R 13/22* (2013.01); *H01R 13/635* (2013.01); *H05K 1/181* (2013.01); *H05K 2201/10393* (2013.01); *H05K 2201/10424* (2013.01)

(58) Field of Classification Search
CPC . H01L 23/32; H01R 12/7058; H01R 12/7076; H01R 13/22
USPC .......................................................... 439/55
See application file for complete search history.

(56) References Cited

U.S. PATENT DOCUMENTS

| 4,810,200 A | * | 3/1989 | Sakamoto | G06K 7/0047 |
| | | | | 439/155 |
| 5,073,116 A | * | 12/1991 | Beck, Jr. | H05K 7/1069 |
| | | | | 206/724 |
| 5,380,213 A | * | 1/1995 | Piorunneck | H05K 7/1084 |
| | | | | 439/160 |
| 5,389,000 A | * | 2/1995 | DiViesti | H01R 12/7005 |
| | | | | 439/157 |
| 5,571,025 A | * | 11/1996 | Arai | H01R 12/7005 |
| | | | | 439/160 |
| 5,573,427 A | * | 11/1996 | Sagano | H05K 7/1023 |
| | | | | 206/724 |

(Continued)

FOREIGN PATENT DOCUMENTS

CN 204315804 U 5/2015

*Primary Examiner* — Alexander Gilman
(74) *Attorney, Agent, or Firm* — Wei Te Chung; Ming Chieh Chang

(57) ABSTRACT

A clip for use with an electronic package, includes a frame structure with a pair of first side bars and a pair of second side bars commonly defining a receiving cavity. An ejection device is formed on one first side bar, including a stopper/kicker and a presser interlinked with each other in a co-movement manner. A latch is located around the ejection device so as to cooperate with the stopper/kicker to secure the electronic package therebetween in a vertical direction and retain the electronic package in the receiving cavity to result in an electrical assembly.

20 Claims, 9 Drawing Sheets

(56) References Cited

U.S. PATENT DOCUMENTS

| | | | |
|---|---|---|---|
| 5,660,552 A * | 8/1997 | Suzuki | H05K 7/1409 439/157 |
| 5,662,485 A * | 9/1997 | Yip | H05K 7/1409 439/157 |
| 5,672,072 A * | 9/1997 | Arai | H05K 7/1409 439/160 |
| 6,340,306 B1 * | 1/2002 | Daoud | H01R 13/6273 439/219 |
| 6,503,093 B1 * | 1/2003 | Sakata | H01R 12/7005 439/160 |
| 6,651,817 B2 * | 11/2003 | Shim | G01R 1/04 206/560 |
| 6,802,728 B1 * | 10/2004 | Howell | H05K 7/1061 439/160 |
| 7,500,867 B1 * | 3/2009 | Doglio | H01R 13/5812 248/251 |
| 7,815,456 B2 * | 10/2010 | Kunioka | H01R 13/2421 439/331 |
| 7,871,275 B1 * | 1/2011 | McClellan | H05K 7/10 439/71 |
| 8,787,035 B2 * | 7/2014 | Mason | H01R 13/2414 361/807 |
| 9,231,318 B2 * | 1/2016 | Liu | H01L 23/32 |
| 9,385,457 B2 | 7/2016 | Chawla et al. | |
| 2010/0167572 A1 * | 7/2010 | Terhune, IV | H01R 13/193 439/331 |
| 2014/0162475 A1 * | 6/2014 | Chawla | H01R 12/724 439/76.1 |
| 2014/0328037 A1 * | 11/2014 | Yeh | H01R 4/48 361/760 |
| 2016/0261068 A1 * | 9/2016 | Nagase | H01R 12/722 |
| 2018/0159253 A1 * | 6/2018 | Liao | H01R 12/88 |
| 2018/0190561 A1 * | 7/2018 | Wu | H01L 23/32 |

\* cited by examiner

EASILY DETACHABLE CPU CLIP

1. FIELD OF THE DISCLOSURE

The invention is related to a clip for use with a CPU (Central Processing Unit), and particularly to the clip with an ejector for removal of the CPU therefrom.

2. DESCRIPTION OF RELATED ARTS

U.S. Pat. No. 9,385,457 discloses a clip for holding an electronic package for use among a heat sink device, an electronic package and the connector. Anyhow, the securing between the clip and the electronic package is relatively hard, thus tending to damage the clip during disassembling the electronic package from the clip, if necessary.

Therefore, a clip with reliable securing mechanism and convenient releasing mechanism with regard to the electronic package is desired.

SUMMARY OF THE DISCLOSURE

A clip for use with an electronic package, includes a frame structure with a pair of first side bars and a pair of second side bars commonly defining a receiving cavity. An ejection device is formed on one first side bar, including a stopper/kicker and a presser interlinked with each other in a co-movement manner. A latch is located around the ejection device so as to cooperate with the stopper/kicker to secure the electronic package therebetween in a vertical direction and retain the electronic package in the receiving cavity to result in an electrical assembly. During disassembling the electronic package from the clip, the presser is downwardly pressed and the stopper/kicker is upwardly moved due to a lever operation effect so as to eject the electronic package out of the clip wherein the latch is optionally deflected to release the electronic package therefrom due to twisting derived from downward movement of the presser.

DETAILED DESCRIPTION OF THE PREFERRED EMBODIMENT

Figure 1:
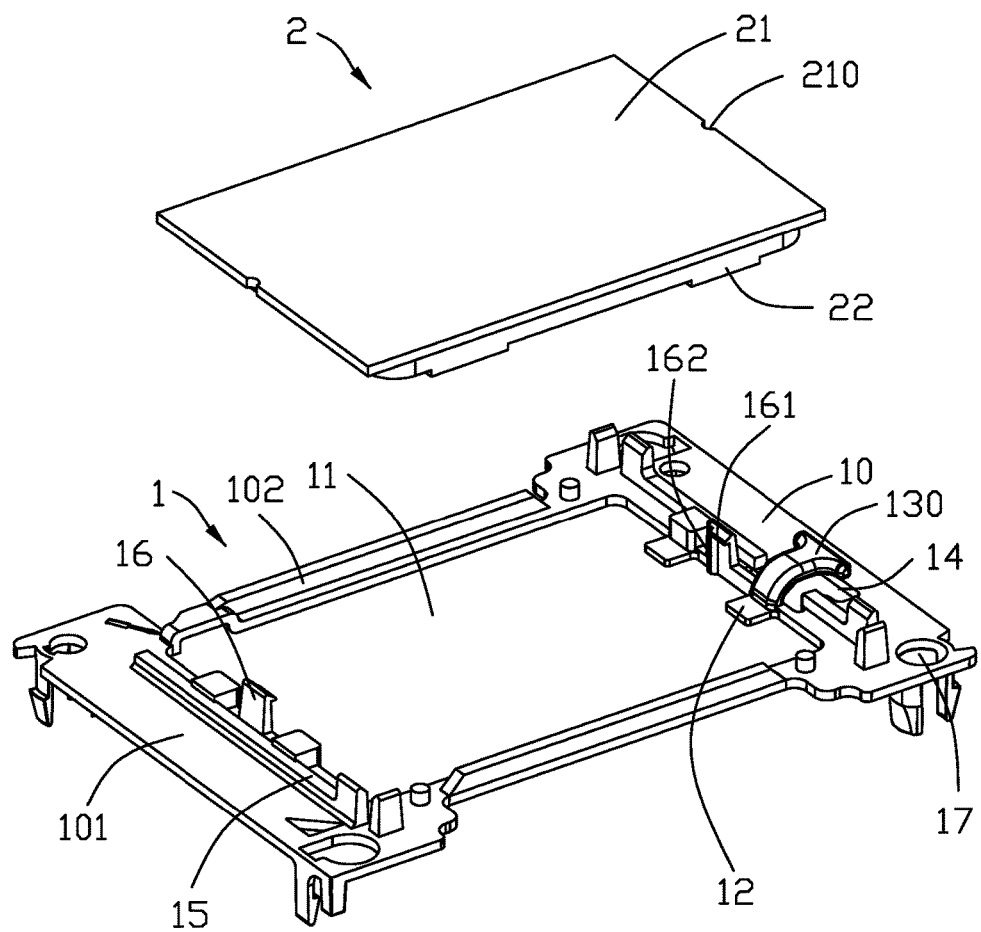
FIG. 1 is an exploded perspective view of the electrical assembly of the invention including a clip with the associated electronic package removed away therefrom.
Figure 1A:
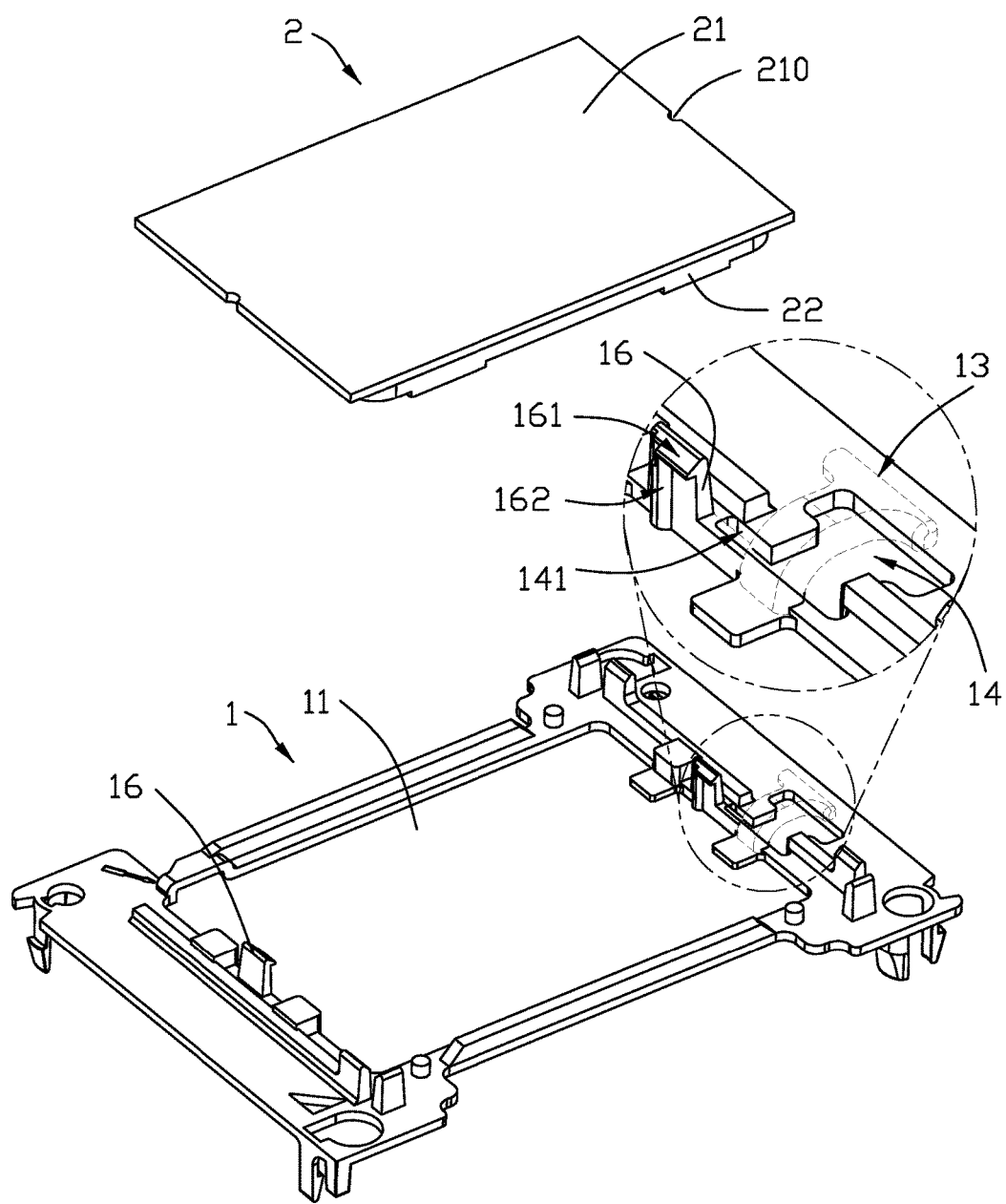
FIG. 1(A) shows the enlarged view of the electrical assembly around the stopper//kicker and the presser.
Figure 2:
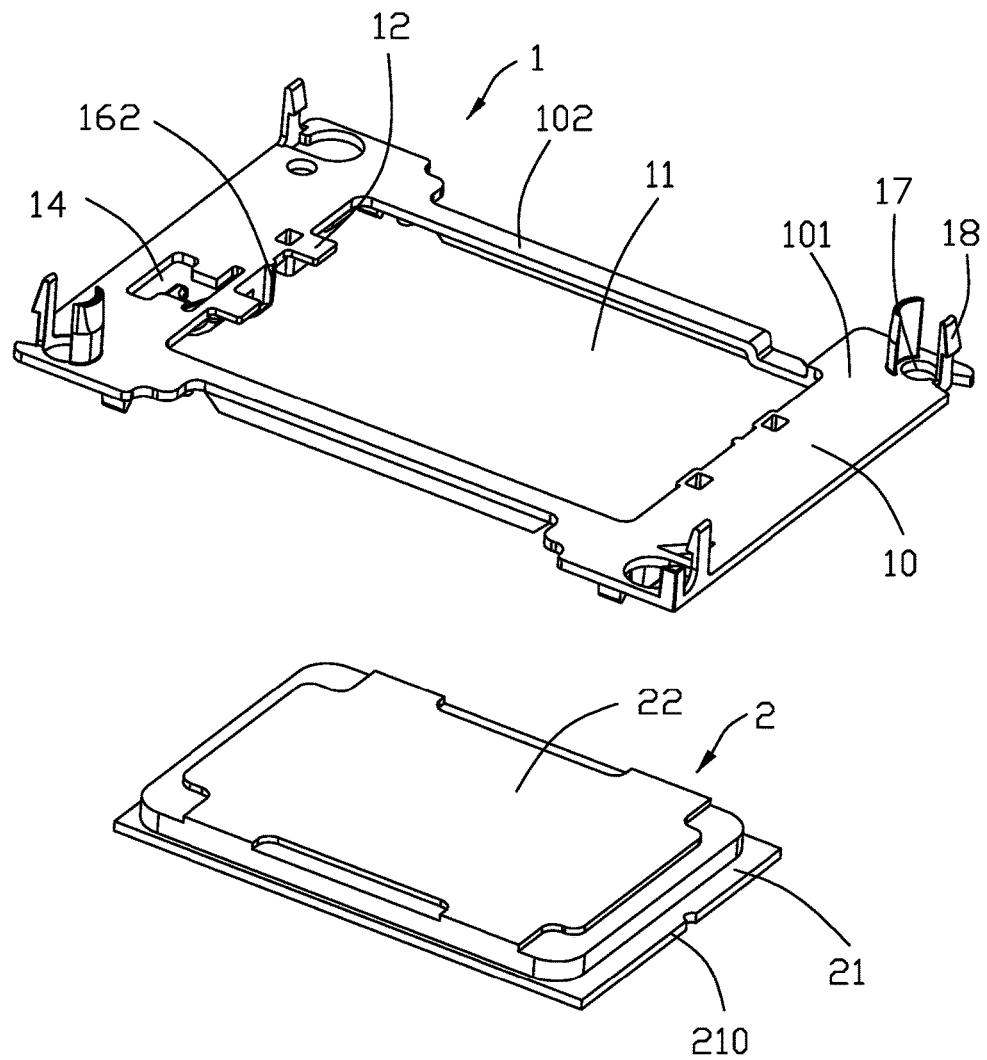
FIG. 2 is another exploded perspective view of the electrical assembly of FIG. 1.
Figure 3:
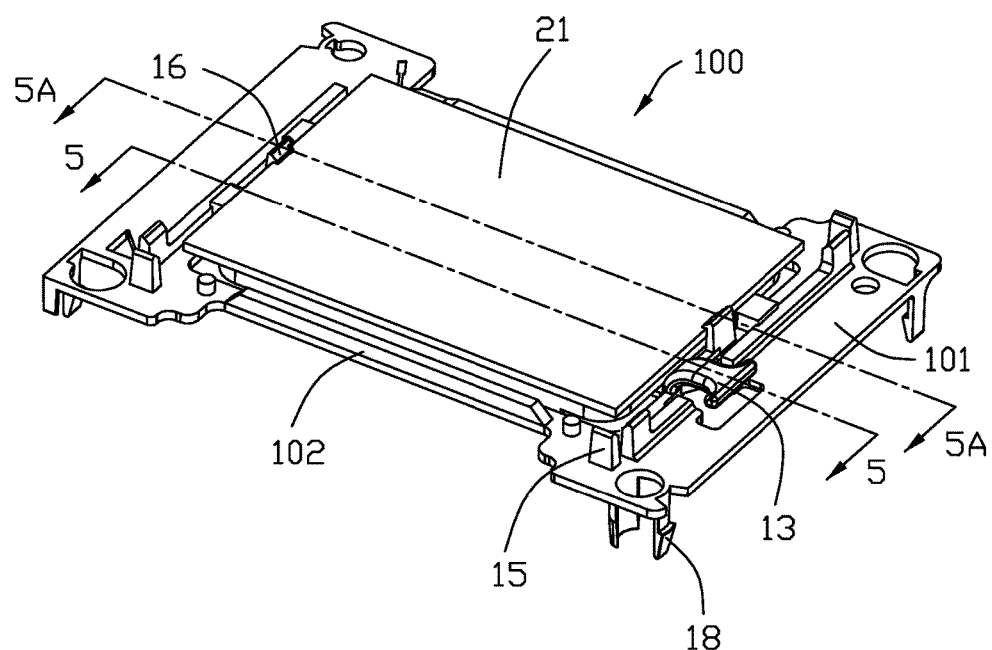
FIG. 3 is an assembled perspective view of the electrical assembly of FIG. 1.
Figure 4:
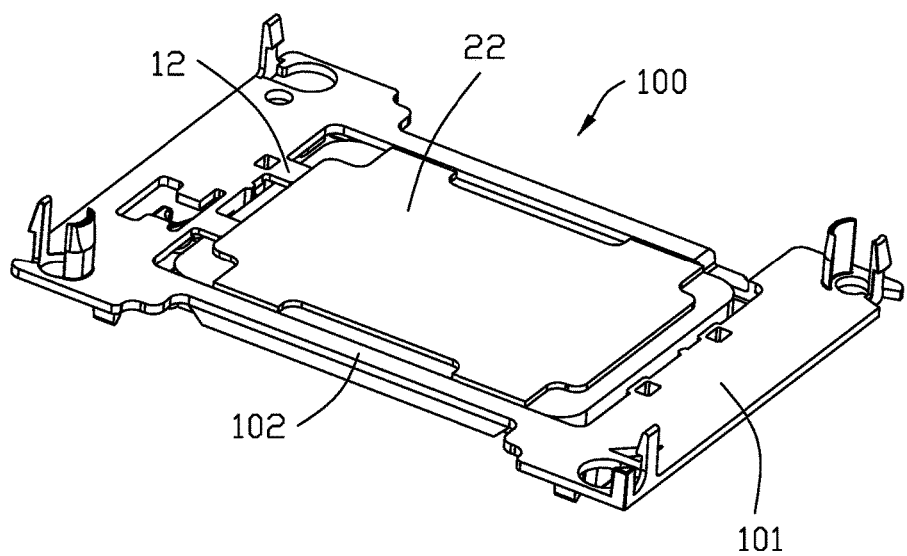
FIG. 4 is another assembly perspective view of the electrical assembly of FIG. 1.
Figure 5:
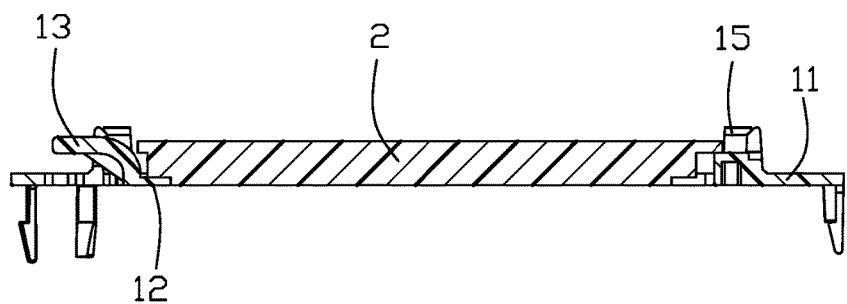
FIG. 5 is a cross-sectional view of the electrical assembly of FIG. 1.
Figure 5A:
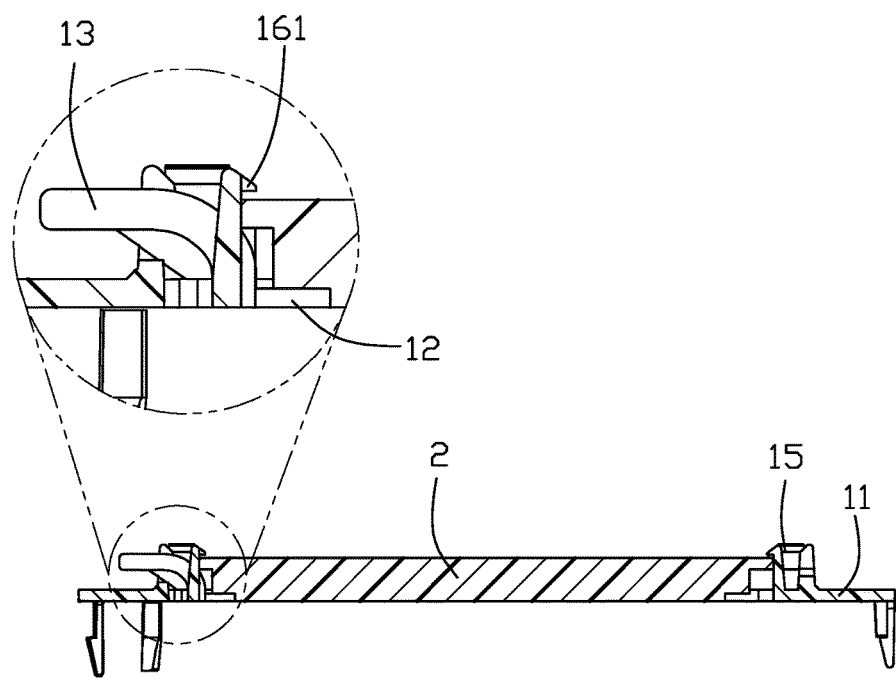
FIG. 5(A) is another cross-sectional view of the electrical assembly of FIG. 1 to show the electronic package is retained between the latch and the stopper/kicker.
Figure 6:
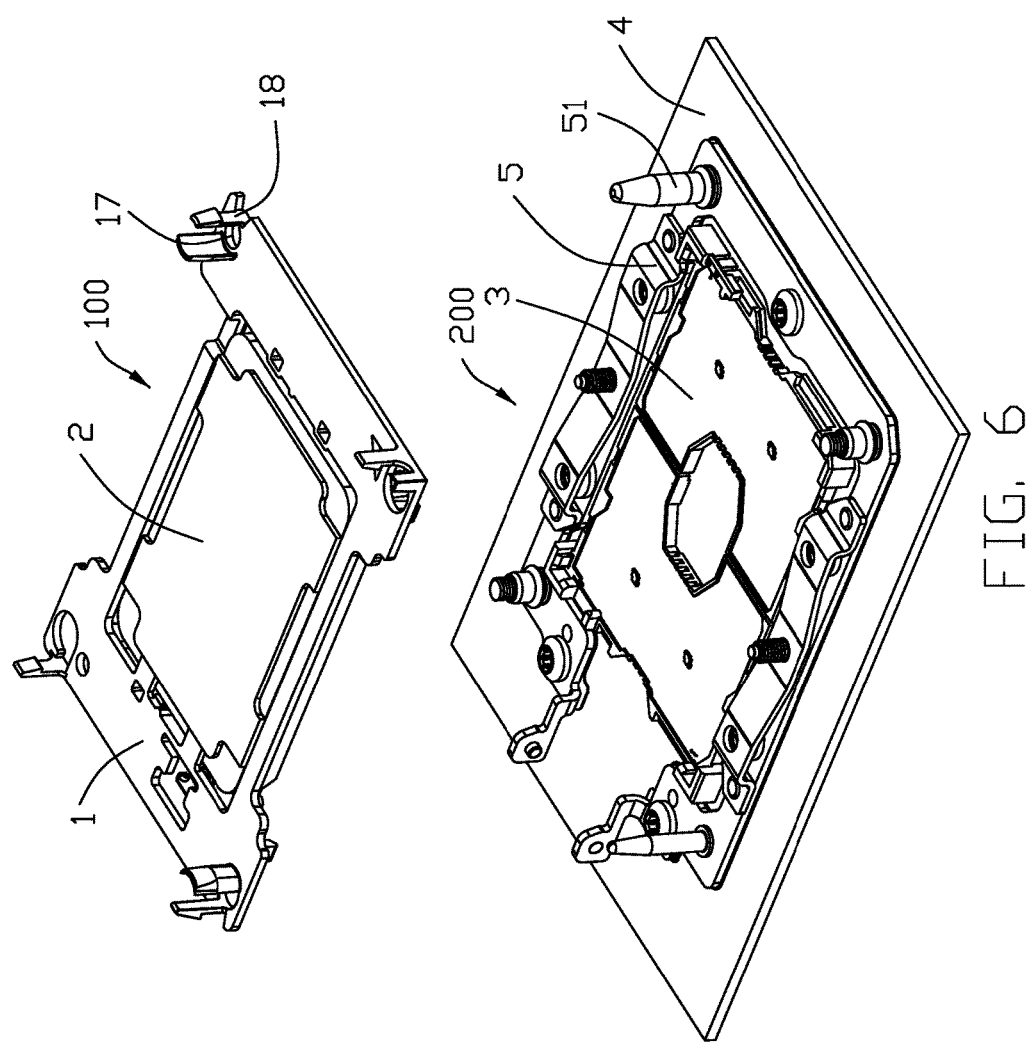
FIG. 6 is an exploded perspective view of the electrical assembly of FIG. 4 and printed circuit board assembly to which the electrical assembly is assembled.
Figure 7:
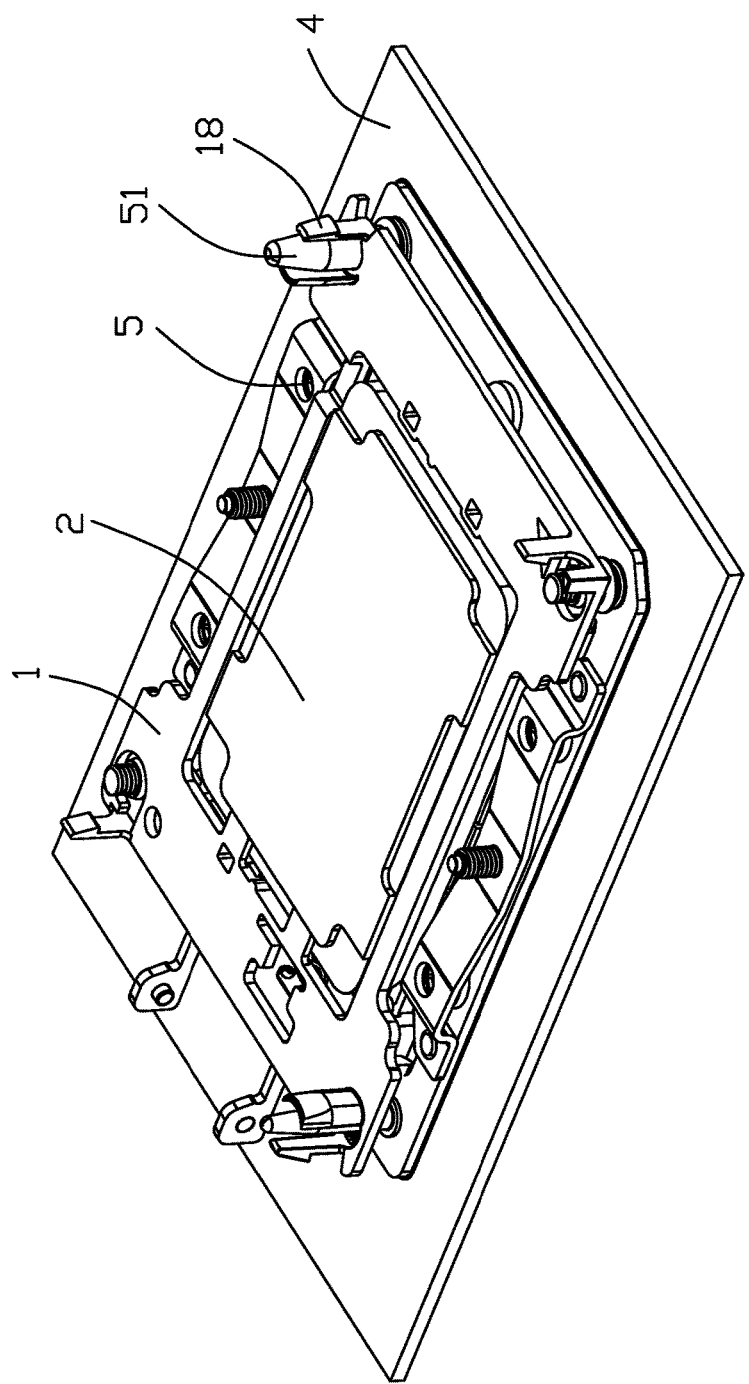
FIG. 7 is an assembled perspective view of the electrical assembly which is assembled upon the printed circuit board assembly of FIG. 6.

Reference will now be made in detail to the embodiments of the present disclosure. Referring to FIGS. 1-7, an electrical assembly 100 includes a clip 1 and an electronic package 2 retained by the clip 1. The electrical assembly 100 is adapted to be mounted upon the printed circuit board assembly 200 for connecting the electronic package 2 to the printed circuit boar 4.

The clip 1 includes a frame structure 10 with a receiving cavity 11 therein for receiving the electronic package 2. The frame structure 10 includes a pair of short bars 101 extending along a transverse direction, and a pair of long bars 102 extending along a front-to-back direction and linked with the pair of short bars 101. The long bars 101 have the positioning blocks 15 for engaging the housing 3 of the electrical connector (illustrated later). One of the short bars 101 includes a stopper/kicker 12 and a presser 13 interlinked with each other in a lever manner along a direction perpendicular to the short bar 101. The stopper/kicker 12 functions to not only support/retain the electronic package 2 in use but also eject out the electronic package 2 from the clip 1 when necessary. The presser 13 extends in direction away from the receiving cavity 11, and includes a pressing head 130. Correspondingly, the short bar 101 forms a groove 14 for not only allowing deflection of the presser 13 but also enhancing flexibility/deformation of around the stopper/kicker 12. Therefore, when the presser 13 is downwardly deflected, the stopper/kicker 12 is upwardly deflected correspondingly.

A latch 16 is formed on the short bar 101 and includes a hook 161 extending toward the receiving cavity 11, and a rib 162. The hook 161 cooperates with the stopper/kicker 12 to sandwich the electronic package 2 therebetween in the vertical direction. In this embodiment, on each short bar 101, there is one latch 16 and a pair of stopper/kicker 12 by two sides of the latch 16 forming three points retention to commonly retain the electronic package 2 in position. Four through holes 17 are formed around four corners of the clip 1 and equipped with locks 18 for securing to the heat sink assembly (not shown).

The electronic package 2 is adapted to be received within the receiving cavity 11 and includes a substrate 21 and a chip 22 thereon. The substrate 21 forms pair of notches 210 to receive the corresponding ribs 162 during assembling. Notably, during removing the electronic package 2 from the clip 1, the presser 13 is downwardly moved to actuate the stopper/kicker 12 to upwardly move, eject and disengage the electronic package 2 from the clip 1. Understandably, if necessary, the transverse end 141 of the groove 14 may further extend to a area behind the latch 16 to make the latch more soft so as to be moved in response to the downward movement of the presser 13 due to a twisting effect occurring thereabouts.

The printed circuit board assembly 200 includes an insulative housing 3, the printed circuit board 4, and the metallic frame 5. The metallic frame 5 is mounted upon the printed circuit board 4 and surrounds the housing 3. During assembling, the electronic package 2 is firstly assembled within the clip 1 as the electrical assembly 100. Secondly, the electrical assembly 100 is mounted to a bottom face of the heat sink assembly (not shown) via the locks 18. Finally, the electrical assembly 100 with the associated heat sink assembly (not shown) is assembled to printed circuit board assembly 200 wherein the positioning blocks 15 are engaged between the housing 3 and the metallic frame 5, and the positioning posts 51 extend through the corresponding through holes 17 and into the heat sink assembly (not shown). It is noted that the metallic frame 5 forms a space 50 above the printed circuit board 4 corresponding to the presser 13 in the vertical direction for avoiding any interference between the presser 13 and the metallic frame 5.

While a preferred embodiment according to the present disclosure has been shown and described, equivalent modifications and changes known to persons skilled in the art according to the spirit of the present disclosure are considered within the scope of the present disclosure as described in the appended claims.

What is claimed is:

1. An electrical assembly comprising:
an electronic package received within a clip;
said clip including:
a single-piece frame structure defining a receiving cavity exposed to an exterior both upwardly and downwardly, in which the electronic package is fully circumferentially received, and including a latch and a stopper/kicker commonly extending into the receiving cavity from the frame and locking/sandwiching the electronic package therebetween in a vertical direction; wherein
the frame further includes a presser interlinked with the stopper/kicker so as to upwardly move the stopper/kicker for ejecting the electronic package from the clip by downwardly deflecting the presser.

2. The electrical assembly as claimed in claim 1, wherein the stopper/kicker is essentially aligned with the presser in a front-to-back direction perpendicular to said vertical direction.

3. The electrical assembly as claimed in claim 1, wherein said frame structure includes a pair of long bars and a pair of short bar, and the presser and the stopper/kicker are located on one of the short bars.

4. The electrical assembly as claimed in claim 3, wherein each of the long bars extends along the front-to-back direction.

5. The electrical assembly as claimed in claim 3, wherein the latch is located on the same short bar with the presser and the stopper/kicker.

6. The electrical assembly as claimed in claim 1, wherein a rib is formed on the latch to be received within a notch of the electronic package.

7. The electrical assembly as claimed in claim 1, wherein the frame structure includes a groove behind the presser so as to have the presser and the stopper/kicker interact with each other in a lever manner.

8. The electrical assembly as claimed in claim 7, wherein the latch is on a same side of the frame structure with the presser and the stopper/kicker, and the end of the groove extends in a transverse direction, which is perpendicular to the vertical direction, toward and close to the latch so as to have the latch interact with the presser in a twisting operation when the presser is downward moved.

9. The electrical assembly as claimed in claim 8, wherein said latch and said stopper/kicker commonly extend into the receiving cavity in a front-to-back direction perpendicular to both the vertical direction and the transverse direction.

10. The electrical assembly as claimed in claim 9, wherein the latch and the stopper/kicker are arranged with three point retention to the electronic package.

11. An electrical assembly comprising:
an electronic package received within a clip;
said clip including:
a single-piece frame structure defining a receiving cavity in which the electronic package is received, and unitarily including a latch and a stopper/kicker commonly extending into the receiving cavity and locking/sandwiching the electronic package therebetween in a vertical direction; wherein
the frame further unitarily includes a presser interlinked with the stopper/kicker so as to upwardly move the stopper/kicker for ejecting the electronic package from the clip via twisting derived from downward deflection of the presser.

12. The electrical assembly as claimed in claim 11, wherein the stopper/kicker is essentially aligned with the presser in a front-to-back direction perpendicular to said vertical direction.

13. The electrical assembly as claimed in claim 11, wherein said frame structure includes a pair of long bars and a pair of short bar, and the presser and the stopper/kicker are located on one of the short bars.

14. The electrical assembly as claimed in claim 13, wherein each of the long bars extends along the front-to-back direction.

15. The electrical assembly as claimed in claim 13, wherein the latch is located on the same short bar with the presser and the stopper/kicker.

16. The electrical assembly as claimed in claim 11, wherein a rib is formed on the latch to be received within a notch of the electronic package.

17. The electrical assembly as claimed in claim 11, wherein the frame structure includes a groove behind the presser so as to have the presser and the stopper/kicker interact with each other in a lever manner.

18. The electrical assembly as claimed in claim 17, wherein the latch is on a same side of the frame structure with the presser and the stopper/kicker, and the end of the groove extends in a transverse direction, which is perpendicular to the vertical direction, toward and close to the latch so as to have the latch interact with the presser in a twisting operation when the presser is downward moved.

19. The electrical assembly as claimed in claim 18, wherein said latch and said stopper/kicker commonly extend into the receiving cavity in a front-to-back direction perpendicular to both the vertical direction and the transverse direction.

20. The electrical assembly as claimed in claim 19, wherein the latch and the stopper/kicker are arranged with three point retention to the electronic package.

* * * * *